(12) United States Patent
Yu (10) Patent No.: US 11,330,709 B2
(45) Date of Patent: *May 10, 2022

(54) FLEXIBLE PRINTED CIRCUIT BOARD

(71) Applicant: AMOGREENTECH CO., LTD., Gyeonggi-do (KR)

(72) Inventor: Jeong Sang Yu, Gyeonggi-Do (KR)

(73) Assignee: AMOGREENTECH CO., LTD., Gyeongggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/967,765

(22) PCT Filed: Jan. 31, 2019

(86) PCT No.: PCT/KR2019/001376
§ 371 (c)(1),
(2) Date: Aug. 6, 2020

(87) PCT Pub. No.: WO2019/164153
PCT Pub. Date: Aug. 29, 2019

(65) Prior Publication Data
US 2020/0389972 A1 Dec. 10, 2020

(30) Foreign Application Priority Data
Feb. 20, 2018 (KR) .................. 10-2018-0019970

(51) Int. Cl.
*H05K 1/02* (2006.01)
*H05K 1/03* (2006.01)
(Continued)

(52) U.S. Cl.
CPC .......... *H05K 1/032* (2013.01); *H05K 1/0298* (2013.01); *H05K 1/0393* (2013.01); *H05K 1/024* (2013.01);
(Continued)

(58) Field of Classification Search
CPC .... H05K 1/032; H05K 1/0298; H05K 1/0393; H05K 2201/015; H05K 1/024; H05K 3/281; H05K 3/4635
See application file for complete search history.

(56) References Cited

U.S. PATENT DOCUMENTS 4,824,511 A * 4/1989 Hartman .............. H05K 3/4655
156/306.6
6,500,529 B1 * 12/2002 McCarthy .............. H05K 1/034
174/258

(Continued)

FOREIGN PATENT DOCUMENTS

EP 0374272 A1 12/1990
JP 2008-188792 A 8/2008
(Continued)

*Primary Examiner* — Ishwarbhai B Patel
(74) *Attorney, Agent, or Firm* — CL Intellectual LLC (57) ABSTRACT

A flexible printed circuit board according to the present disclosure includes: a first base sheet, a second base sheet, and a first protection sheet. The first base sheet includes a first Teflon film and a first circuit pattern disposed on the first Teflon film. The second base sheet includes a second Teflon film and a second circuit pattern disposed on the second Teflon film, and is laminated on the first base sheet. The first protection sheet covers the first base sheet. A portion of the first base sheet that is exposed to the first protection sheet is surface-modified.

7 Claims, 7 Drawing Sheets (51) Int. Cl.
  *H05K 1/11* (2006.01)
  *H05K 1/18* (2006.01)
  *H05K 3/28* (2006.01)
  *H05K 3/46* (2006.01)

(52) U.S. Cl.
  CPC .............. *H05K 1/11* (2013.01); *H05K 1/189* (2013.01); *H05K 3/281* (2013.01); *H05K 3/4635* (2013.01); *H05K 2201/015* (2013.01)

(56) References Cited

U.S. PATENT DOCUMENTS

| | | | | |
|---|---|---|---|---|
| 6,552,099 | B2* | 4/2003 | Yamamoto | C08J 3/28 522/150 |
| 11,006,531 | B1* | 5/2021 | Dan | H05K 3/467 |
| 2005/0150596 | A1* | 7/2005 | Vargo | B32B 15/08 156/324 |
| 2006/0180343 | A1* | 8/2006 | Chan | H05K 3/383 174/256 |
| 2007/0246254 | A1* | 10/2007 | Kumar | H05K 3/4617 174/264 |
| 2008/0148562 | A1* | 6/2008 | Tu | H05K 3/4697 29/852 |
| 2009/0250253 | A1* | 10/2009 | Park | H05K 3/4658 174/258 |
| 2011/0154658 | A1* | 6/2011 | Chuang | H05K 3/0097 29/829 |
| 2017/0236777 | A1* | 8/2017 | Bagung | H01L 23/4985 174/254 |
| 2017/0327630 | A1* | 11/2017 | Kiya | H05K 3/281 |
| 2019/0008044 | A1* | 1/2019 | Karavakis | H05K 1/0313 |

FOREIGN PATENT DOCUMENTS

| | | |
|---|---|---|
| JP | 2015-56555 A | 3/2015 |
| JP | 2016-79346 A | 5/2016 |
| JP | 2018-504776 A | 2/2018 |

* cited by examiner

FLEXIBLE PRINTED CIRCUIT BOARD

CROSS-REFERENCE TO RELATED APPLICATIONS

This application is a National Stage of International patent application PCT/KR2019/001376, filed on Jan. 31, 2019, which claims priority to foreign Korean patent application No. KR 10-2018-0019970, filed on Feb. 20, 2018, the disclosures of which are incorporated by reference in their entirety.

FIELD OF THE INVENTION

The present disclosure relates to a flexible printed circuit board, and more particularly, to a flexible printed circuit board including a Teflon film.

BACKGROUND

Generally, a flexible printed circuit board (FPCB) is a board which may be bent flexibly by forming a circuit pattern on a thin insulating film, and is often used for transmitting data signals between devices to a display device such as a portable electronic device.

The flexible printed circuit board is manufactured by printing a circuit pattern on a film type base board. Since the flexible printed circuit board is put into a process in which a high temperature is applied, such as a bonding process of a driving chip, the base board is required to have heat resistance. Accordingly, a polyimide film is used as the base board in order to satisfy the aforementioned required heat resistance of the base board.

Further, as the flexible printed circuit board is used for transferring a high frequency signal, the base board may be required to have low dielectric constant characteristics in order to prevent the transmitted electrical signal from being lost. Accordingly, Teflon is used as the base board in order to satisfy the aforementioned required low dielectric constant characteristics of the base board.

SUMMARY OF THE INVENTION

An object of the present disclosure is to provide a flexible printed circuit board to which a Teflon film having a structure which may be easily manufactured is applied.

For achieving the object, a flexible printed circuit board according to the present disclosure includes a first base sheet, a second base sheet, and a first protection sheet. The first base sheet includes a first Teflon film and a first circuit pattern disposed on the first Teflon film. The second base sheet includes a second Teflon film and a second circuit pattern disposed on the second Teflon film, and the second base sheet is laminated on the first base sheet. The first protection sheet covers the first base sheet. A portion of the first base sheet exposed to the first protection sheet is surface-modified.

In an exemplary embodiment of the present disclosure, the first base sheet further includes a first surface modified layer. The first surface modified layer is disposed on the outer surface of the first Teflon film and the outer surface of the first circuit pattern.

In an exemplary embodiment of the present disclosure, the flexible printed circuit board further includes a second protection sheet covering the second base sheet. A portion of the second base sheet exposed to the second protection sheet is surface-modified.

In an exemplary embodiment of the present disclosure, the second base sheet further includes a second surface modified layer. The second surface modified layer is disposed on the outer surface of the second Teflon film and the outer surface of the second circuit pattern.

In an exemplary embodiment of the present disclosure, a constituent material of each of the first surface modified layer and the second surface modified layer includes a metal oxide.

In an exemplary embodiment of the present disclosure, the flexible printed circuit board further includes: an intermediate Teflon film, a first adhesive sheet, and a second adhesive sheet. The intermediate Teflon film is interposed between the first base sheet and the second base sheet. A first adhesive sheet is interposed between the first base sheet and the intermediate Teflon film to bond the intermediate Teflon film to the first base sheet. A second adhesive sheet is interposed between the second base sheet and the intermediate Teflon film to bond the intermediate Teflon film to the second base sheet.

In an exemplary embodiment of the present disclosure, each of the first adhesive sheet and the second adhesive sheet is an adhesive polypropylene film.

In an exemplary embodiment of the present disclosure, the first base sheet further includes a first sub-circuit pattern disposed on the first Teflon film, the second base sheet further includes a second sub-circuit pattern which is disposed on the second Teflon film. The first circuit pattern is disposed on one surface of the first Teflon film, and the first sub-circuit pattern is disposed on the other surface of the first Teflon film. Further, the second circuit pattern is disposed on one surface of the second Teflon film, and the second sub-circuit pattern is disposed on the other surface of the second Teflon film.

According to the present disclosure, even if the flexible printed circuit board includes the Teflon film having releasability, the adhesive property between the protection sheet and the base sheet may be improved by forming the surface modified layer on the portion exposed to the protection sheet. Accordingly, the protection sheet may be prevented from being peeled from the base sheet during the manufacturing process or storage of the flexible printed circuit board, and accordingly, the state of the finished product of the flexible printed circuit board may be safely preserved.

As a result, the Teflon film with releasability may be sufficiently used as the base board of the flexible printed circuit board, and accordingly, the flexible printed circuit board with a low dielectric constant and a high heat resistance may be easily implemented by using the advantages of the Teflon film.

DETAILED DESCRIPTION

Hereinafter, the most preferred exemplary embodiments of the present disclosure will be described with reference to the accompanying drawings in order to specifically describe the exemplary embodiments so that those skilled in the art to which the present disclosure pertains may easily implement the technical spirit of the present disclosure. First, in adding reference numerals to the components of each drawing, it should be noted that the same components have the same reference numerals as much as possible even if they are displayed in different drawings. Further, in describing the present disclosure, when it is determined that the detailed description of the related well-known configuration or function may obscure the gist of the present disclosure, the detailed description thereof will be omitted.

Figure 1:
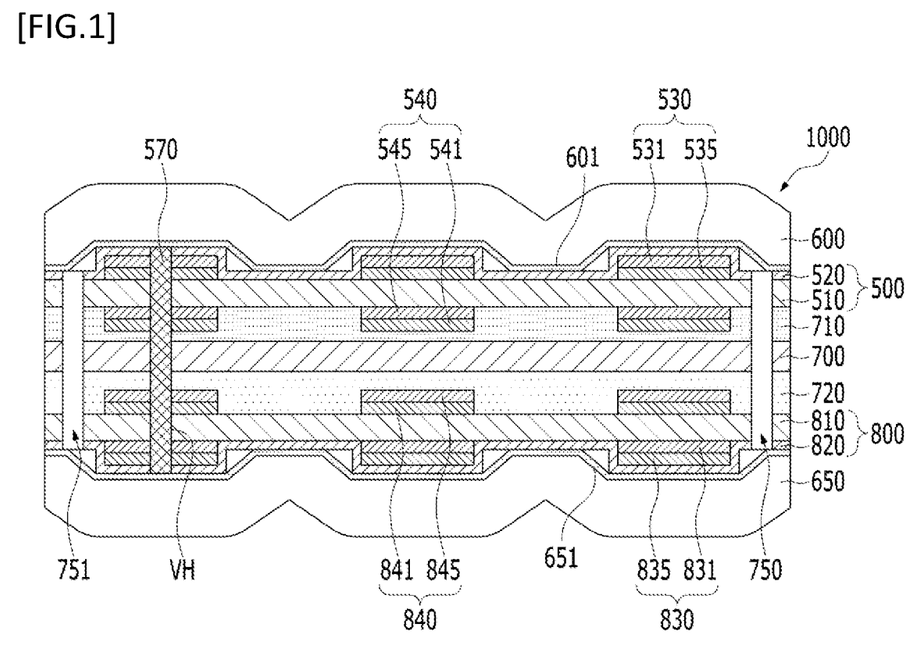
FIG. 1 is a cross-sectional diagram of a flexible printed circuit board according to an exemplary embodiment of the present disclosure.

Referring to FIG. 1, a flexible printed circuit board 1000 includes a first base sheet 500, a second base sheet 800, an intermediate Teflon film 700, a first adhesive sheet 710, a second adhesive sheet 720, a connection pattern 570, a first protection sheet 600, and a second protection sheet 650.

The first base sheet 500 includes a first Teflon film 510, a first circuit pattern 530, a first sub-circuit pattern 540, and a first surface modified layer 520.

A constituent material of the first Teflon film 510 includes Teflon (poly tetra fluoro ethylene (PTFE)). Generally, Teflon is a material with a high heat resistance and a low dielectric constant as compared to other polymer materials. By applying the first Teflon film 510 to the flexible printed circuit board 1000, the deformation of the flexible printed circuit board 1000 caused by a high temperature generated in a process of mounting a semiconductor chip on the flexible printed circuit board 1000 may be decreased, and the loss of a signal may be decreased in the process of transmitting the electrical signal by the flexible printed circuit board 1000.

The first circuit pattern 530 is disposed on the first Teflon film 510. The electrical signal input to an input terminal of the flexible printed circuit board 1000 is transmitted to an output terminal of the flexible printed circuit board 1000 by the first circuit pattern 530. In the present exemplary embodiment, the first circuit pattern 530 includes a seed layer 535 and a plating layer 531 laminated on the seed layer 535, and a constituent material of the seed layer 535 may include nickel, and a constituent material of the plating layer 531 may include copper.

In terms of a method for manufacturing the first circuit pattern 530, a pre-seed layer (not illustrated) is formed on the Teflon film using a sputtering method, and the seed layer 535 is formed by patterning the pre-seed layer. Thereafter, the first circuit pattern 530 may be formed by forming the plating layer 531 on the seed layer 535 using an electrolytic plating method.

The first sub-circuit pattern 540 is disposed on the first Teflon film 510, and the first sub-circuit pattern 540 faces the first circuit pattern 530 with the first Teflon film 510 interposed therebetween. That is, the first circuit pattern 530 is disposed on one surface of the first Teflon film 510, and the first sub-circuit pattern 540 is disposed on the other surface of the first Teflon film 510.

In the present exemplary embodiment, the first sub-circuit pattern 540 includes a seed layer 545 and a plating layer 541 disposed on the seed layer 545. As described above, the location of the first sub-circuit pattern 540 is different from the location of the first circuit pattern 530 with respect to the first Teflon film 510, but since the configuration of the first sub-circuit pattern 540 is similar to the configuration of the first circuit pattern 530, a more detailed description of the first sub-circuit pattern 540 is omitted.

In the present exemplary embodiment, a portion of the first base sheet 500 exposed to the first protection sheet 600 is surface-modified. More specifically, the first surface modified layer 520 is formed on the outer surface of the first Teflon film 510 and the outer surface of the first circuit pattern 530, such that the effect of modifying the surface occurs in the first base sheet 500.

In the present exemplary embodiment, the first surface modified layer 520 may contain a metal oxide such as titanium oxide (TiOx). Further, since the first surface modified layer 520 has a shape of a thin film thinner than the first circuit pattern 530 with a thickness of about 5 μm, the first surface modified layer 520 may have conductivity.

Further, in terms of the manufacturing method, after the metal particles are provided to the first Teflon film 510 by a sputtering method, the first surface-modified layer 520 may be made of a metal oxide which is formed by the metal particles reacting with a reaction gas containing oxygen. Accordingly, if the first protection sheet 600 with an adhesive layer 601 covers the first base sheet 500, the adhesive layer of the first protection sheet 600 may be bonded to the first surface-modified layer 520 instead of the first Teflon film 510, thereby improving the adhesive force between the first protection sheet 600 and the first base sheet 500 by the first surface modified layer 520.

Unlike the exemplary embodiment of the present disclosure, when the structure of the first surface modified layer 520 is omitted from the first base sheet 500, portions of the first base sheet 500 which are in contact with the first protection sheet 600 are the outer surface of the first Teflon film 510 and the outer surface of the first circuit pattern 530, and in this case, the first protection sheet 600 and the first base sheet 500 may not be easily bonded by the releasability of the first Teflon film 510. However, as described above, in the present exemplary embodiment, the first surface modified layer 520 is formed on the portions of the first base sheet 500 exposed to the first protection sheet 600, that is, the outer surface of the first Teflon film 510 and the outer surface of the first circuit pattern 530, thereby improving the adhesive force between the first base sheet 500 and the first protection sheet 600 by the first surface modified layer 520.

The second base sheet 800 includes a second Teflon film 810, a second circuit pattern 830, a second sub-circuit pattern 840, and a second surface modified layer 820. In the present exemplary embodiment, since a structure of the second base sheet 800 is similar to a structure of the first base sheet 500, the structure of the second base sheet 800 will be briefly described.

A constituent material of the second Teflon film 810 includes Teflon, and the second circuit pattern 830 is disposed on the second Teflon film 810 to transmit electrical signals. In the present exemplary embodiment, the second circuit pattern 830 includes a seed layer 831 and a plating layer 835 laminated on the seed layer 831.

The second sub-circuit pattern 840 is disposed on the second Teflon film 810, and the second sub-circuit pattern 840 faces the second circuit pattern 830 with the second Teflon film 810 interposed therebetween. That is, the second circuit pattern 830 is disposed on one surface of the second Teflon film 810, and the second sub-circuit pattern 840 is disposed on the other surface of the second Teflon film 810. In the present exemplary embodiment, the second sub-circuit pattern 840 includes a seed layer 841 and a plating layer 845 disposed on the seed layer 841.

In the present exemplary embodiment, a portion of the second base sheet 800 exposed to the second protection sheet 650 is surface-modified. More specifically, the second surface modified layer 820 is formed on the outer surface of the second Teflon film 810 and the outer surface of the second circuit pattern 830, and the effect of modifying the surface in the second base sheet 800 is caused by the second surface-modified layer 820. Accordingly, if the second protection sheet 650 with an adhesive layer 651 covers the second base sheet 800, the adhesive layer of the second protection sheet 800 may be bonded to the second surface-modified layer 820 instead of the second Teflon film 810, thereby improving the adhesive force between the second protection sheet 650 and the second base sheet 800 by the second surface modified layer 820.

In the present exemplary embodiment, the second surface modified layer 820 may contain a metal oxide such as titanium oxide (TiOx). Further, since the second surface modified layer 820 has a shape of a film thinner than the second circuit pattern 830 with a thickness of about 5 μm, the second surface modified layer 820 may have conductivity.

The intermediate Teflon film 700 is interposed between the first base sheet 500 and the second base sheet 800. In the present exemplary embodiment, a constituent material of the intermediate Teflon film 700 includes Teflon like the first Teflon film 510 and the second Teflon film 810.

The first adhesive sheet 710 is interposed between the first base sheet 500 and the intermediate Teflon film 700 to bond the intermediate Teflon film 700 to the first base sheet 500. Further, the second adhesive sheet 720 is interposed between the second base sheet 800 and the intermediate Teflon film 700 to bond the intermediate Teflon film 700 to the second base sheet 800.

In the present exemplary embodiment, each of the first adhesive sheet 710 and the second adhesive sheet 720 may be an adhesive polypropylene film with a low dielectric constant. For example, each of the first adhesive sheet 710 and the second adhesive sheet 720 may be a casted polypropylene (CPP) film with sealants formed on both sides of a polypropylene (PP) film.

The connection pattern 570 is a conductive layer which is filled in a via hole formed through at least one of the first base sheet 500 and the second base sheet 800, and the connection pattern 570 electrically connects at least two of the first circuit pattern 530, the first sub-circuit pattern 540, the second circuit pattern 830, and the second sub-circuit pattern 840. In terms of the manufacturing method, in the present exemplary embodiment, after the via hole penetrating the first base sheet 500 and the second base sheet 800 is formed, the connection pattern 570 may be formed by filling the conductive material in the via hole.

The first protection sheet 600 is disposed on the uppermost of the flexible printed circuit board 1000 to cover the first base sheet 500, and the second protection sheet 650 is disposed on the lowermost of the flexible printed circuit board 1000 to cover the second base sheet 800. In the present exemplary embodiment, the first protection sheet 600 and the second protection sheet 650 are components which protect the first base sheet 500 and the second base sheet 800, respectively, and if the flexible printed circuit board 1000 is bonded to other electronic components, the first protection sheet 600 and the second protection sheet 650 may be removed from the flexible printed circuit board 1000.

In the present exemplary embodiment, each of the first protection sheet 600 and the second protection sheet 650 may include an insulating film and an adhesive layer laminated on one surface of the insulating film. For example, each of the first protection sheet 600 and the second protection sheet 650 may include a polyimide film and an adhesive layer formed on one surface of the polyimide film.

In the present exemplary embodiment, a first guide hole 750 may be formed in one side of the flexible printed circuit board 1000, and a second guide hole 751 may be formed in the other side of the flexible printed circuit board 1000. Each of the first guide hole 750 and the second guide hole 751 may be formed in a shape of penetrating the laminated components of the flexible printed circuit board 1000. The first guide hole 750 and the second guide hole 751 are used to align the laminated components, which will be described in more detail with reference to FIGS. 3 to 6.

Figure 2:
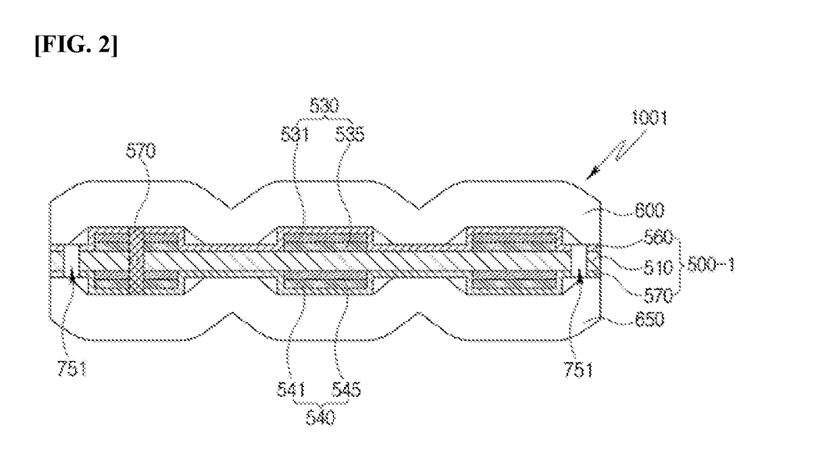
FIG. 2 is a cross-sectional diagram of a flexible printed circuit board according to another exemplary embodiment of the present disclosure.

FIG. 2 illustrates a cross-sectional diagram of a flexible printed circuit board 1001 according to another exemplary embodiment of the present disclosure. In describing FIG. 2, reference numerals are used for components described with reference to FIG. 1, and duplicate descriptions of the components are omitted.

Referring to FIG. 2, the flexible printed circuit board 1001 includes a base sheet 500-1, a first protection sheet 600, and a second protection sheet 650.

In the present exemplary embodiment, the base sheet 500-1 includes a Teflon film 510, a first circuit pattern 530, a first sub-circuit pattern 540, a first surface modified layer 560, a second surface modified layer 570, a connection pattern 570-1, a first protection sheet 600, and a second protection sheet 650.

In the exemplary embodiment described above with reference to FIG. 1, the circuit patterns are provided on both sides of each of the first Teflon film (510 in FIG. 1) and the second Teflon film (810 in FIG. 1), such that the flexible printed circuit board (1000 in FIG. 1) includes the circuit patterns composed of a total of four layers, but in the exemplary embodiment illustrated in FIG. 2, circuit patterns are disposed on both sides of one Teflon film 510, such that the flexible printed circuit board 1001 includes circuit patterns composed of a total of two layers.

In the present exemplary embodiment, the portions of the base sheet 500-1 exposed to the first protection sheet 600 and the second protection sheet 650 are surface-modified. More specifically, the first surface modified layer 560 is formed on one surface of the Teflon film 510 and disposed on the outer surface of the Teflon film 510 and the outer surface of the first circuit pattern 530, and the second surface modified layer 570 is formed on the other surface of the Teflon film 510 and is disposed on the outer surface of the Teflon film 510 and the outer surface of the first sub-circuit pattern 540.

According to the structures of the first surface modified layer 560 and the second surface modified layer 570 described above, the adhesive layer of the first protection sheet 600 may be in contact with the first surface modified layer 560 instead of the Teflon film 510, thereby improving the adhesive force between the first protection sheet 600 and the base sheet 500-1. Further, the adhesive layer of the second protection sheet 650 may be in contact with the second surface modified layer 570 instead of the Teflon film 510, thereby improving the adhesive force between the second protection sheet 650 and the base sheet 500-1.

Figure 3:
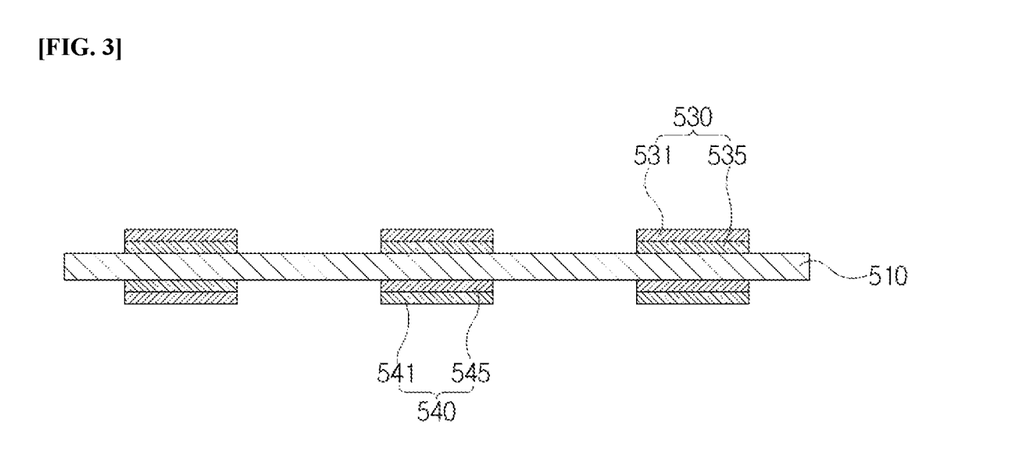
FIGS. 3 to 7 are diagrams illustrating a method for manufacturing the flexible printed circuit board illustrated in FIG. 1.

Referring to FIG. 3, the first circuit pattern 530 including a seed layer 535 and a plating layer 531 is formed on one surface of the first Teflon film 510, and the first sub-circuit pattern 540 including a seed layer 545 and a plating layer 541 is formed on the other surface of the first Teflon film 510.

In the present exemplary embodiment, metal layers may be formed on both sides of the first Teflon film 510 using a sputtering method, and the seed layers 353, 545 may be formed by performing a patterning process such as a photolithography process on the metal layers. Thereafter, the plating layers 531, 541 may be formed on the seed layers 535, 545 by performing an electrolytic plating process using the seed layers 535, 545.

Figure 4:
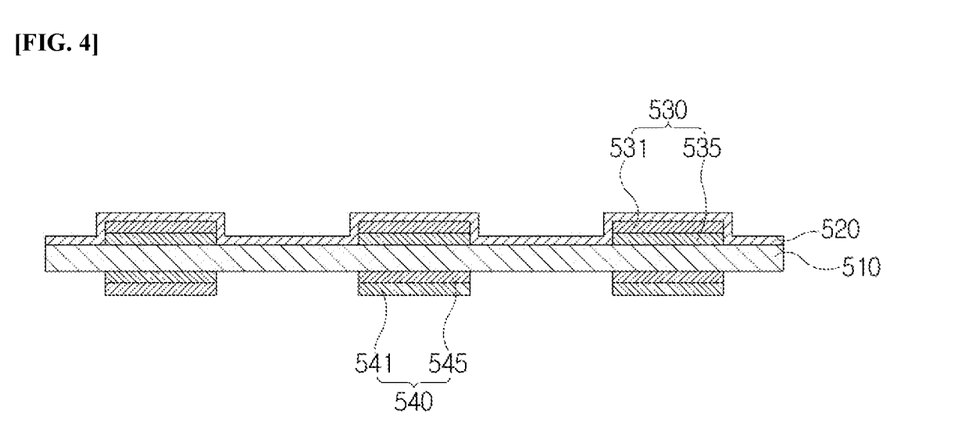

Referring to FIG. 4, the first surface modified layer 520 is formed through a film forming process in which metal layers are allowed to react with a reaction gas containing oxygen, after the metal layers are formed on the outer surface of the first Teflon film 510 and the outer surface of the first circuit pattern 530 by performing a sputtering process.

In the present exemplary embodiment, titanium is applied as the target of the sputtering process, such that the constituent material of the metal layer may include titanium. Accordingly, the constituent material of the first surface modified layer 520 may include titanium oxide formed by reacting metal particles containing titanium with oxygen.

In the present exemplary embodiment, the metal particles containing titanium are provided into the first Teflon film 510 while the sputtering process is performed, and the first surface modified layer 520 is formed by the metal oxide generated by chemical reaction between the metal particles and the reaction gas containing oxygen, such that an uneven pattern may be formed on the surface of the first surface modified layer 520.

Figure 5:
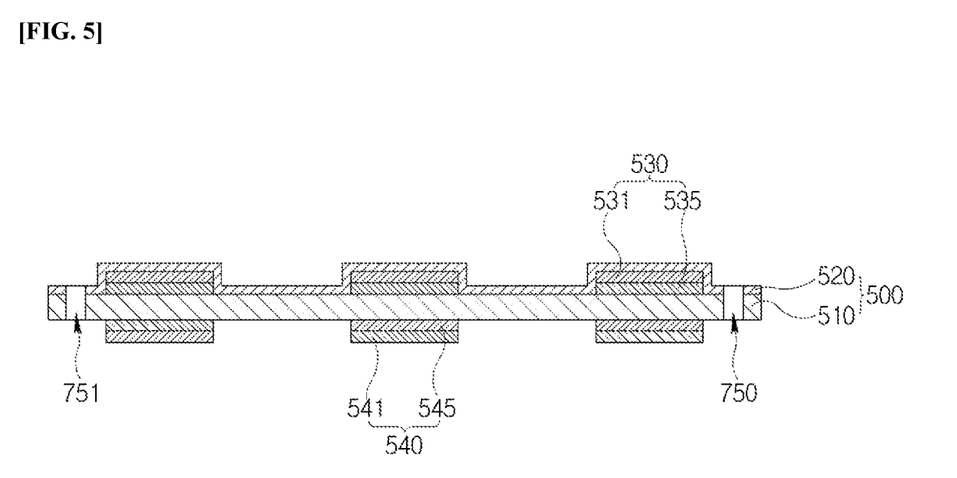

Referring to FIG. 5, the first guide hole 750 and the second guide hole 751 are formed in both sides of each of the first Teflon film 510 and the first surface modified layer 520. Each of the first guide hole 750 and the second guide hole 751 is formed in a shape of penetrating the first Teflon film 510 and the first surface modified layer 520.

In the present exemplary embodiment, the first guide hole 750 and the second guide hole 751 may be formed using a punching process or a laser drill process.

Figure 6:
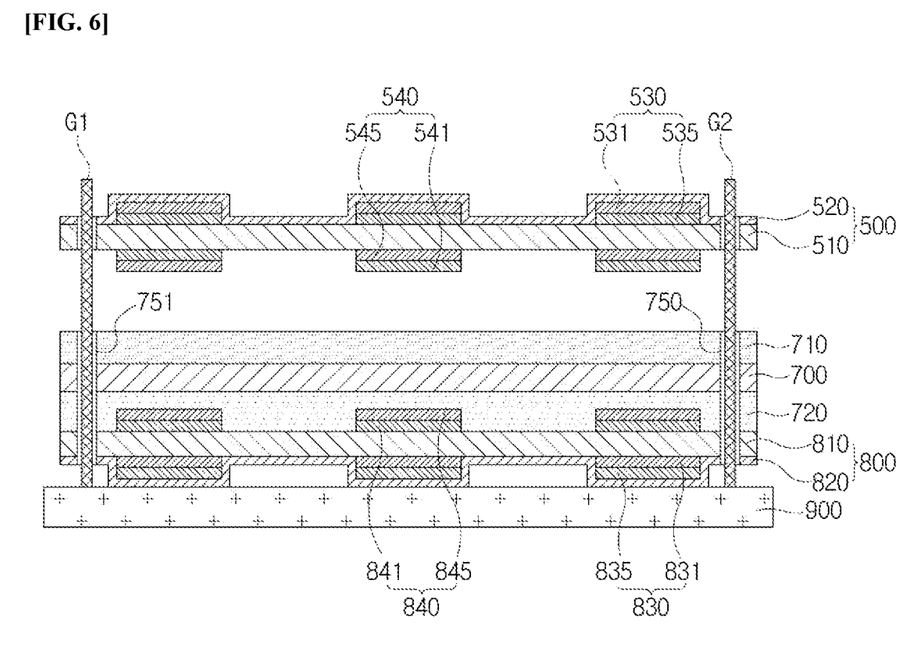

Referring to FIG. 6, the second base sheet 800 is manufactured in the same method as the method for manufacturing the first base sheet 500 described above with reference to FIGS. 3 to 5. Thereafter, the second base sheet 800 is disposed on a jig 900 so that a first guide pin G1 and a second guide pin G2 of the jig 900 each penetrates the first guide hole 751 and the second guide hole 752.

Thereafter, a laminate composed of the intermediate Teflon film 700, the first adhesive sheet 710, and the second adhesive sheet 720 is laminated on the second base sheet 800, such that the second adhesive sheet 720 is bonded to the second base sheet 800. In this process, since the first guide hole 750 and the second guide hole 751, which are formed in the intermediate Teflon film 700, the first adhesive sheet 710, and the second adhesive sheet 720 are each penetrated by the first guide pin G1 and the second guide pin G2, the laminate composed of the intermediate Teflon film 700, the first adhesive sheet 710, and the second adhesive sheet 720 is laminated and simultaneously aligned on the second base sheet 800.

Thereafter, the first base sheet 500 is laminated on the first adhesive sheet 710 to bond the first base sheet 500 to the first adhesive sheet 710. As a result, the first base sheet 500, the intermediate Teflon film 700, and the second base sheet 800 are formed as a single laminate by the first adhesive sheet 710 and the second adhesive sheet 720.

Figure 7:
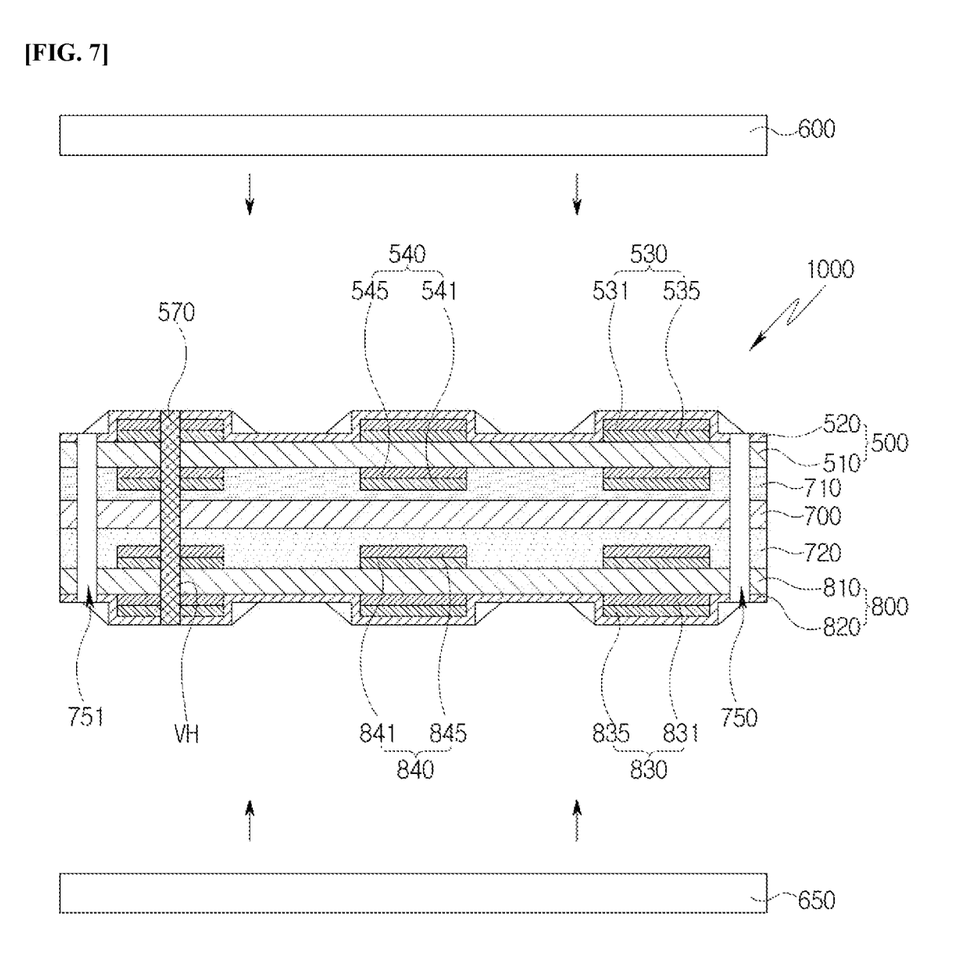

Referring to FIG. 7, a via hole which penetrates the first base sheet 500 and the second base sheet 800 is formed, and the connection pattern 570 is formed by filling a conductive pattern in the via hole.

Thereafter, the first base sheet 500 is covered with the first protection sheet 600 so that the adhesive layer formed on the inner surface of the first protection sheet 600 is in contact with the first surface modified layer 520. Further, the second base sheet 800 is covered with the second protection sheet 650 so that the adhesive layer formed on the inner surface of the second protection sheet 650 is in contact with the second surface modified layer 820.

Accordingly, even if the first base sheet 500 and the second base sheet 800 each include the first Teflon film 510 and the second Teflon film 810, the adhesive layer of the first protection sheet 600 may be bonded to the first surface modified layer 520 instead of the first Teflon film 510, thereby improving the adhesive property between the first protection sheet 600 and the first base sheet 500. Further, the adhesive layer of the second protection sheet 650 may be bonded to the second surface modified layer 820 instead of the second Teflon film 810, thereby improving the adhesive property between the second protection sheet 650 and the second base sheet 800.

Although the preferred exemplary embodiments of the present disclosure have been described above, it is understood that the present disclosure may be modified in various forms, and those skilled in the art may carry out various modified examples and changed examples without departing from the scope of the claims of the present disclosure.

The invention claimed is:

1. A flexible printed circuit board comprising: a first base sheet comprising a first Teflon film and a first circuit pattern disposed on the first Teflon film; a second base sheet comprising a second Teflon film and a second circuit pattern disposed on the second Teflon film and laminated on the first base sheet; and a first protection sheet covering the first base sheet wherein an adhesive layer is provided on the first protection sheet, wherein the first base sheet further comprises a first surface modified layer disposed on an outer surface of the first Teflon film and an outer surface of the first circuit pattern, wherein the adhesive layer of the first protection sheet is bonded to the first surface modified layer, and wherein a constituent material of the first surface modified layer comprises a metal oxide.

2. The flexible printed circuit board of claim 1, further comprising a second protection sheet which covers the second base sheet,
   wherein a portion of the second base sheet exposed to the second protection sheet is surface-modified.

3. The flexible printed circuit board of claim 2,
   wherein the second base sheet further comprises a second surface modified layer disposed on the outer surface of the second Teflon film and the outer surface of the second circuit pattern.

4. The flexible printed circuit board of claim 3,
   wherein a constituent material of the second surface modified layer comprises a metal oxide.

5. The flexible printed circuit board of claim 1, further comprising:
   an intermediate Teflon film interposed between the first base sheet and the second base sheet;
   a first adhesive sheet interposed between the first base sheet and the intermediate Teflon film to bond the intermediate Teflon film to the first base sheet; and
   a second adhesive sheet interposed between the second base sheet and the intermediate Teflon film to bond the intermediate Teflon film to the second base sheet.

6. The flexible printed circuit board of claim 5,
   wherein each of the first adhesive sheet and the second adhesive sheet is an adhesive polypropylene film.

7. The flexible printed circuit board of claim 1,
   wherein the first base sheet further comprises a first sub-circuit pattern disposed on the first Teflon film, wherein the second base sheet further comprises a second sub-circuit pattern disposed on the second Teflon film, wherein the first circuit pattern is disposed on one surface of the first Teflon film, and the first sub-circuit pattern is disposed on the other surface of the first Teflon film, and wherein the second circuit pattern is disposed on one surface of the second Teflon film, and the second sub-circuit pattern is disposed on the other surface of the second Teflon film.

\* \* \* \* \*